(12) United States Patent
Matsunami

(10) Patent No.: US 9,355,722 B2
(45) Date of Patent: May 31, 2016

(54) METHOD OF WRITING DATA OF A NONVOLATILE SEMICONDUCTOR MEMORY DEVICE INCLUDING SETTING AND REMOVING OPERATIONS

(71) Applicant: KABUSHIKI KAISHA TOSHIBA, Minato-ku (JP)

(72) Inventor: Junya Matsunami, Yokkaichi (JP)

(73) Assignee: KABUSHIKI KAISHA TOSHIBA, Minato-ku (JP)

(*) Notice: Subject to any disclaimer, the term of this patent is extended or adjusted under 35 U.S.C. 154(b) by 0 days.

(21) Appl. No.: 14/806,380

(22) Filed: Jul. 22, 2015

(65) Prior Publication Data

US 2015/0325296 A1    Nov. 12, 2015

Related U.S. Application Data

(63) Continuation of application No. 14/062,172, filed on Oct. 24, 2013, now Pat. No. 9,117,522.

(30) Foreign Application Priority Data

Jul. 12, 2013    (JP) .................................. 2013-146963

(51) Int. Cl.
    *G11C 11/00*    (2006.01)
    *G11C 13/00*    (2006.01)

(52) U.S. Cl.
    CPC ........ *G11C 13/0097* (2013.01); *G11C 13/0007* (2013.01); *G11C 13/0011* (2013.01);
    (Continued)

(58) Field of Classification Search
    CPC ........... G11C 13/0069; G11C 13/0004; G11C 13/0007

USPC ........................................ 365/148, 185.2, 163
See application file for complete search history.

(56) References Cited

U.S. PATENT DOCUMENTS 6,657,898 B2    12/2003 Hirano
7,153,721 B2    12/2006 Campbell
(Continued)

FOREIGN PATENT DOCUMENTS

JP    2012-203926    10/2012
WO    WO 2012/127718    9/2012

OTHER PUBLICATIONS

Taiwanese Office Action issued Jun. 3, 2015, in Patent Application No. 102139408 (with English translation of Japanese translation).

*Primary Examiner* — Connie Yoha
(74) *Attorney, Agent, or Firm* — Oblon, McClelland, Maier & Neustadt, L.L.P

(57) ABSTRACT

A nonvolatile semiconductor memory device according to an embodiment comprises: a memory cell array including a plurality of memory cells provided one at each of intersections of a plurality of first lines and a plurality of second lines and each storing data by a data storing state of a filament; and a control circuit configured to execute a write sequence that writes data to the memory cell, the write sequence including: a setting operation that applies a setting pulse having a first polarity to the memory cell; and a removing operation that applies a removing pulse having a second polarity opposite to the first polarity to the memory cell; and the control circuit, during execution of the write sequence, is configured to repeatedly execute the setting operation until the memory cell attains a desired data storing state, and then to execute the removing operation.

7 Claims, 12 Drawing Sheets

(52) U.S. Cl.
CPC ........ *G11C13/0064* (2013.01); *G11C 13/0069* (2013.01); *G11C 13/0004* (2013.01); *G11C 2013/0092* (2013.01); *G11C 2213/71* (2013.01); *G11C 2213/73* (2013.01)

(56) References Cited

U.S. PATENT DOCUMENTS

| | | | |
|---|---|---|---|
| 7,462,857 B2 | 12/2008 | Arai et al. | |
| 7,791,935 B2 | 9/2010 | Kang et al. | |
| 7,894,253 B2 | 2/2011 | Kreupl et al. | |
| 8,305,795 B2 | 11/2012 | Azuma et al. | |
| 8,537,591 B2 | 9/2013 | Kim et al. | |
| 9,053,789 B1 * | 6/2015 | Ertosun | G11C 13/0069 |
| 2009/0046499 A1 * | 2/2009 | Philipp | G11C 13/0004 365/163 |
| 2009/0290411 A1 | 11/2009 | Xi et al. | |
| 2010/0103722 A1 | 4/2010 | Nirschl et al. | |
| 2011/0310655 A1 | 12/2011 | Kreupl et al. | |
| 2012/0029586 A1 | 2/2012 | Kumar et al. | |
| 2012/0043519 A1 | 2/2012 | Jo et al. | |
| 2012/0205608 A1 | 8/2012 | Yamauchi et al. | |
| 2013/0250654 A1 * | 9/2013 | Sugimae | G11C 13/0002 365/148 |
| 2014/0104933 A1 | 4/2014 | Yamahira | |
| 2014/0362643 A1 * | 12/2014 | Yasuda | G11C 16/0463 365/185.17 |

* cited by examiner

METHOD OF WRITING DATA OF A NONVOLATILE SEMICONDUCTOR MEMORY DEVICE INCLUDING SETTING AND REMOVING OPERATIONS

CROSS-REFERENCE TO RELATED APPLICATIONS

This application is a continuation of U.S. application Ser. No. 14/062,172 filed Oct. 24, 2013, and is based upon and claims the benefit of priority from the prior Japanese Patent Application No. 2013-146963, filed on Jul. 12, 2013, the entire contents of each of which are incorporated herein by reference.

FIELD

Embodiments of the present invention relate to a nonvolatile semiconductor memory device.

BACKGROUND

In recent years, a resistance varying type memory (ReRAM: Resistive RAM) has been drawing attention as a technology for achieving an even higher degree of integration of a semiconductor memory device.

One kind of resistance varying type memory employs an ion conduction memory as a memory cell, the ion conduction memory being configured having a metal layer and an ion conduction layer stacked therein. When this ion conduction memory is applied with an electrical signal, metal atoms included in the metal layer are ionized and migrate within the ion conduction layer to form a filament configured by metal atoms. The ion conduction memory stores different data according to a state of this formed filament.

However, a problem arises that if this ion conduction memory is left in a room or the like, the formed filament gradually changes, whereby a change occurs also in stored data.

DETAILED DESCRIPTION

A nonvolatile semiconductor memory device according to an embodiment comprises: a memory cell array including a plurality of first lines, a plurality of second lines intersecting the plurality of first lines, and a plurality of memory cells provided one at each of intersections of the plurality of first lines and the plurality of second lines and each storing data by a data storing state of a filament; and a control circuit configured to execute a write sequence that writes data to the memory cell, the write sequence including: a setting operation that applies a setting pulse having a first polarity to the memory cell; and a removing operation that applies a removing pulse having a second polarity opposite to the first polarity to the memory cell; and the control circuit, during execution of the write sequence, is configured to repeatedly execute the setting operation until the memory cell attains a desired data storing state, and then to execute the removing operation.

A nonvolatile semiconductor memory device according to embodiments will be described below with reference to the drawings.

First Embodiment

First, an overall configuration of a nonvolatile semiconductor memory device according to a first embodiment will be described.

Figure 1:
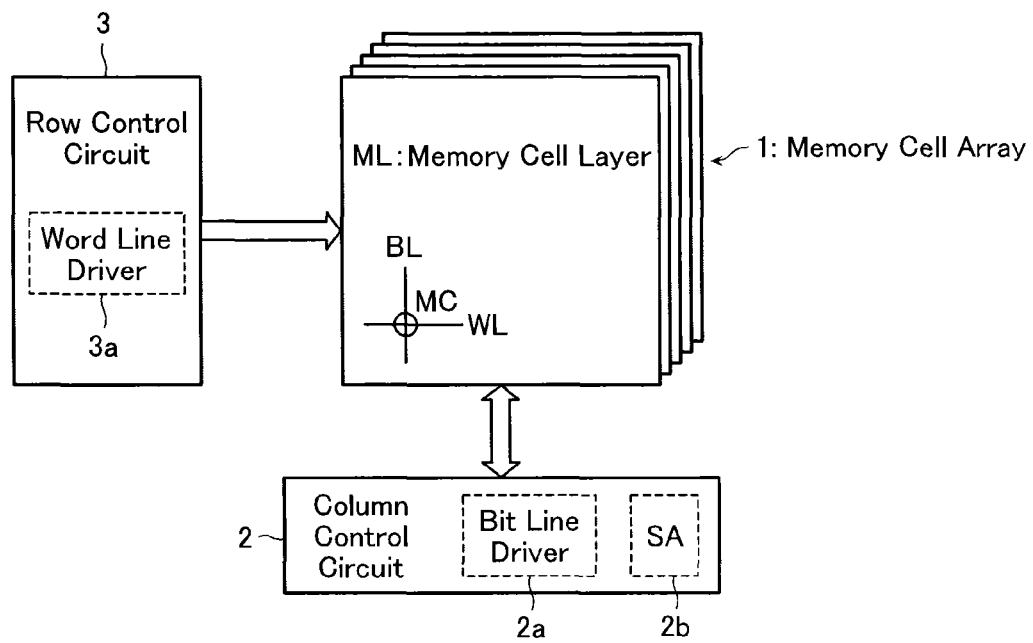
FIG. 1 is a block diagram showing an overall configuration of a nonvolatile semiconductor memory device according to a first embodiment.

FIG. 1 is a block diagram showing the overall configuration of the nonvolatile semiconductor memory device according to the present embodiment.

This nonvolatile semiconductor memory device comprises a memory cell array 1 and a column control circuit 2 and row control circuit 3 that control data erase, data write, and data read with respect to this memory cell array 1. The memory cell array 1 includes a plurality of stacked memory cell layers ML. Each memory cell layer ML includes a plurality of bit lines BL (first lines) and plurality of word lines WL (second lines) that intersect each other, and a memory cell MC connected to each of intersections of these bit lines BL and word lines WL. Note that below, data erase, data write, and data read with respect to the memory cell array 1 or the memory cell MC are sometimes collectively called an "access operation".

The column control circuit 2 is connected to the bit line BL of the memory cell layer ML. The column control circuit 2 controls the bit line BL for the access operation on the memory cell MC. The column control circuit 2 includes a bit line driver 2a and a sense amplifier 2b. The bit line driver 2a includes a decoder and a multiplexer that select the bit line BL and supply the bit line BL with a voltage required in the access operation. The sense amplifier 2b detects/amplifies a current flowing in the memory cell MC during data read, thereby determining data stored by the memory cell MC.

On the other hand, the row control circuit 3 is connected to the word line WL of the memory cell layer ML. The row control circuit 3 selects the word line WL during the access operation. The row control circuit 3 includes a word line driver 3a that supplies the word line WL with a voltage required in the access operation.

Next, the memory cell array 1 will be described.

Figure 2:
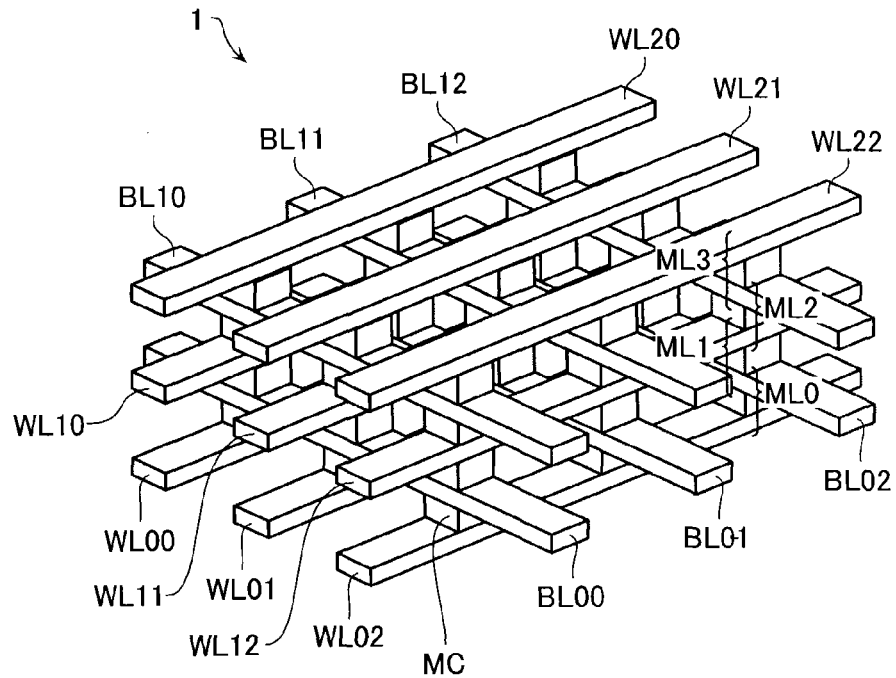
FIG. 2 is a perspective view showing a structure of a memory cell array in the nonvolatile semiconductor memory device according to the same embodiment.

FIG. 2 is a perspective view showing a structure of the memory cell array in the nonvolatile semiconductor memory device according to the present embodiment.

The memory cell array 1 is a cross-point type memory cell array. The memory cell layer ML of the memory cell array 1 includes a plurality of bit lines BL disposed in parallel and a plurality of word lines WL disposed in parallel in a direction intersecting these bit lines BL. The memory cell MC is provided at each of intersections of the bit lines BL and the word lines WL so as to be sandwiched by both lines. As previously mentioned, the memory cell array 1 is formed by stacking a plurality of such memory cell layers ML in multiple layers. Memory cell layers ML adjacent to each other in an up-and-down direction share the bit line BL or the word line WL. In the case shown in FIG. 2, a lowermost layer memory cell layer ML0 of the memory cell array 1 and a memory cell layer ML1 upwardly adjacent to this memory cell layer ML0 share bit lines BL00-BL02 Moreover, in the structure shown in FIG. 2, a stacked structure of a column-shaped memory cell MC is formed at the intersection of the bit line BL and the word line WL as viewed from a stacking direction. However, it is also possible to adopt a structure where a stacked structure of the memory cell MC is formed on an entire surface of a layer between a bit line layer (layer having a plurality of the bit lines BL arranged in a second direction) and a word line layer (layer having a plurality of the word lines WL arranged in a first direction).

Figure 3:
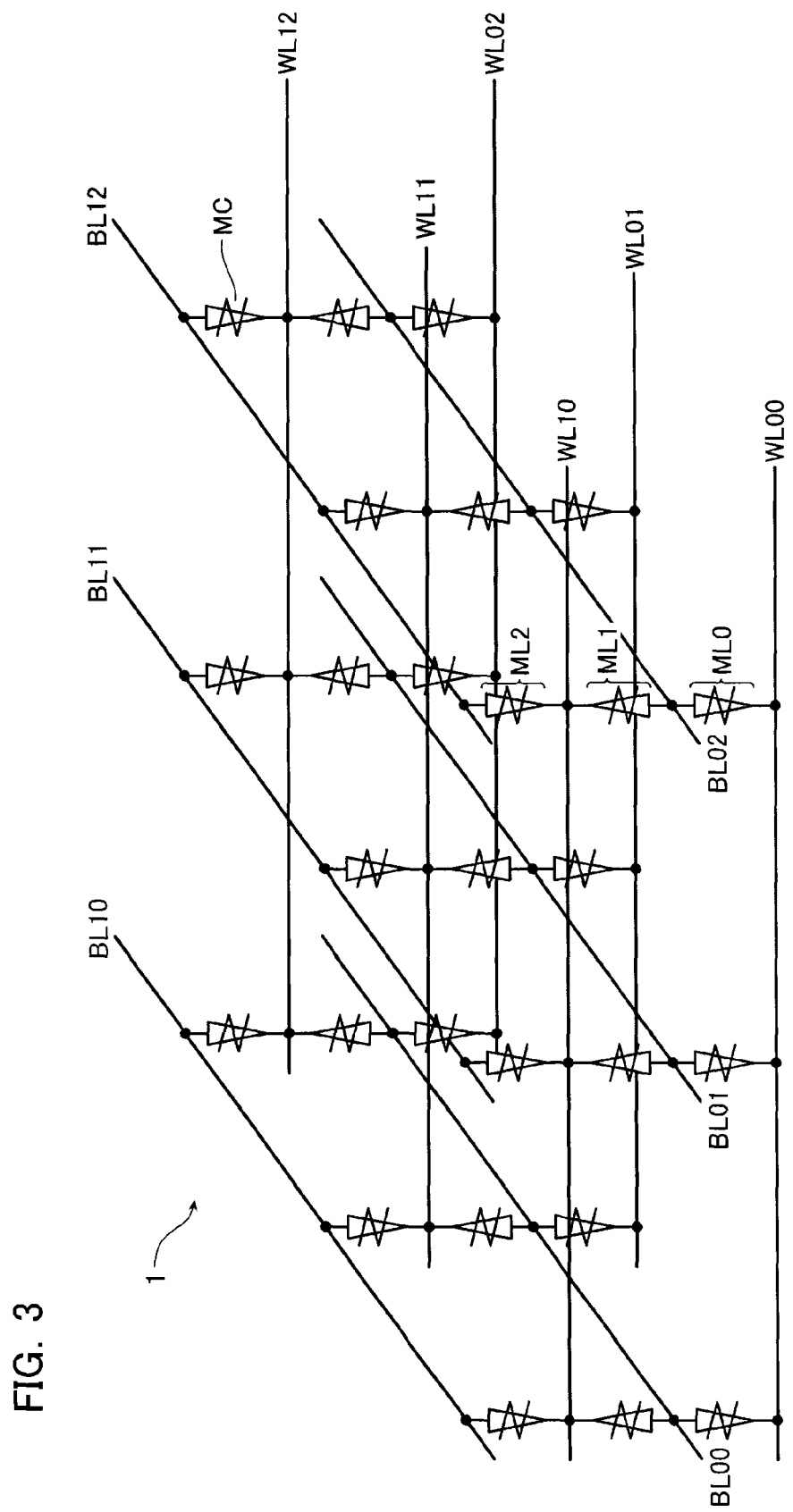
FIG. 3 is an equivalent circuit diagram of the memory cell array in the nonvolatile semiconductor memory device according to the same embodiment.

FIG. 3 is an equivalent circuit diagram of the memory cell array in the nonvolatile semiconductor memory device according to the present embodiment. FIG. 3 is the equivalent circuit diagram of the memory cell array 1 shown in FIG. 2.

As will be mentioned later, the memory cell MC has variable resistance characteristics and non-ohmic characteristics. Note that in the drawings, the memory cell MC is expressed by a symbol combining respective symbols of a resistor and a diode. A triangular shape of this symbol indicates a direction of large current flow, and in the description below, following the diode, a base end side of the triangular shape is also sometimes called an "anode", and a pointed end side of the triangular shape is also sometimes called a "cathode". In addition, a bias where an anode side has a higher voltage than a cathode side is also sometimes called a "forward direction bias", and a bias converse to that is also sometimes called a "reverse direction bias".

In the case shown in FIG. 3, formed in the memory cell array 1, from a lower layer to an upper layer, are word lines WL0$n$ (n=0-2), bit lines BL0$m$ (m=0-2), word lines WL1$n$, and bit lines BL1$m$. Of these, the word lines WL0$n$ and the bit lines BL0$m$, along with memory cells MC0$mn$ provided at the intersections of these word lines WL0$n$ and bit lines BL0$m$, configure the memory cell layer ML0. Similarly, the bit lines BL0$m$ and the word lines WL1$n$, along with memory cells MC1$mn$ provided at the intersections of these bit lines BL0$m$ and word lines WL1$n$, configure the memory cell layer ML1. The word lines WL1$n$ and the bit lines BL1$m$, along with memory cells MC2$mn$ provided at the intersections of these word lines WL1$n$ and bit lines BL1$m$, configure a memory cell layer ML2. In the case shown in FIG. 3, all of the memory cells MC of the memory cell layers ML have the bit line BL connected to the anode side of the memory cell MC and the word line WL connected to the cathode side of the memory cell MC.

Various kinds of patterns are conceivable as the structure of the memory cell array 1, besides the structure shown in FIGS. 2 and 3. Here, examples of those patterns are given.

Figure 4:
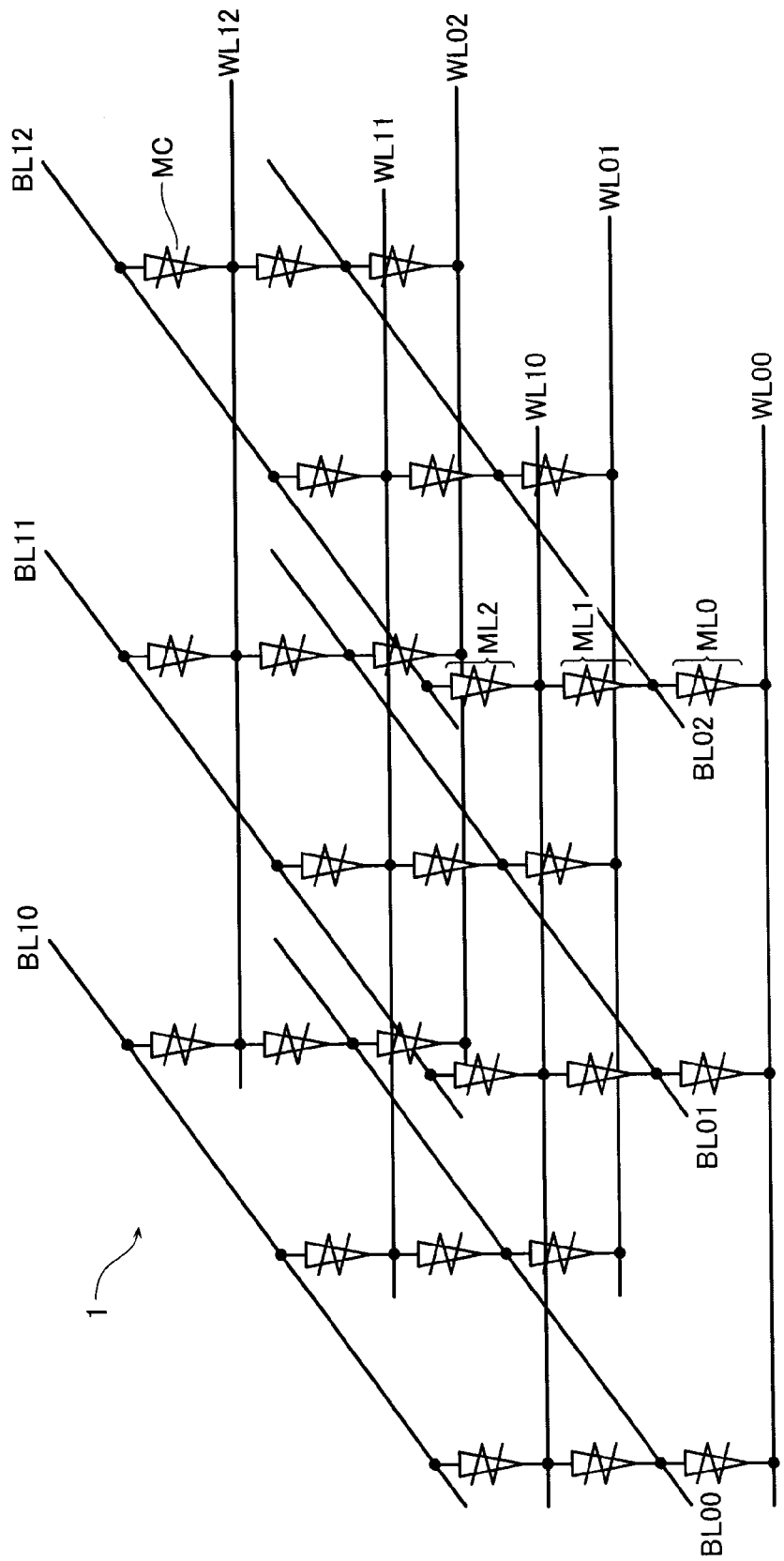
FIG. 4 is another equivalent circuit diagram of the memory cell array in the nonvolatile semiconductor memory device according to the same embodiment.
Figure 5:
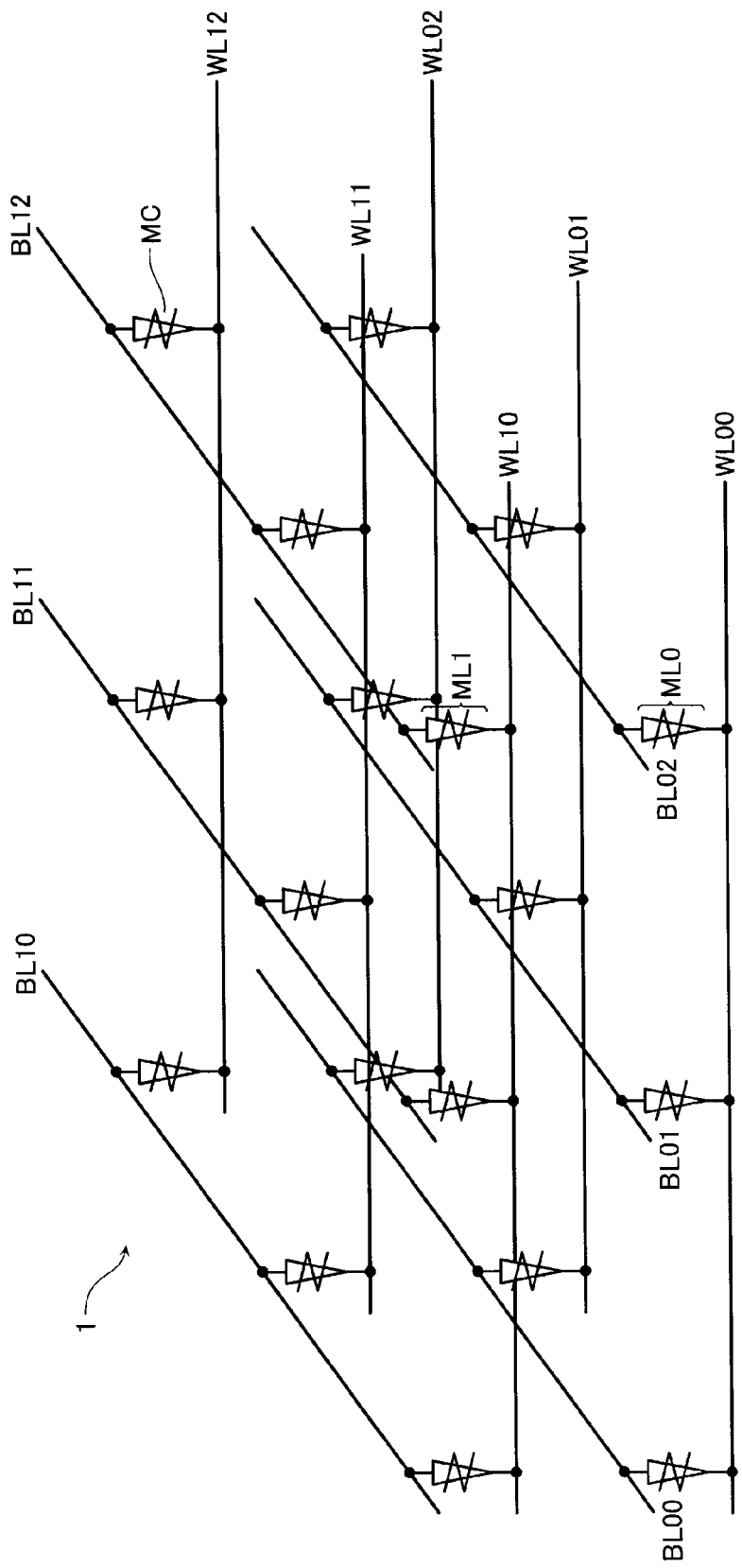
FIG. 5 is another equivalent circuit diagram of the memory cell array in the nonvolatile semiconductor memory device according to the same embodiment.

FIGS. 4 and 5 are other equivalent circuit diagrams of the memory cell array in the nonvolatile semiconductor memory device according to the present embodiment.

In the case shown in FIG. 4, contrary to in the case shown in FIG. 3, the memory cells MC are provided having their current rectifying directions the same in all of the memory cell layers ML. Moreover, in the case shown in FIG. 5, contrary to in the case shown in FIG. 3, all of the memory cell layers ML independently include the bit line BL and the word line WL. The present embodiment may be applied also to various other kinds of structures of the memory cell array 1, besides these.

In order to configure a three-dimensional memory employing the above-described cross-point type memory cell array 1, it is required to provide each memory cell array 1 with the sense amplifier, driver, decoder, multiplexer, and so on, of the kind shown in FIG. 1, as peripheral circuits for performing the access operation on the three-dimensional memory. Accordingly, next, a configuration of the memory cell array 1 and its peripheral circuits will be described.

Figure 6:
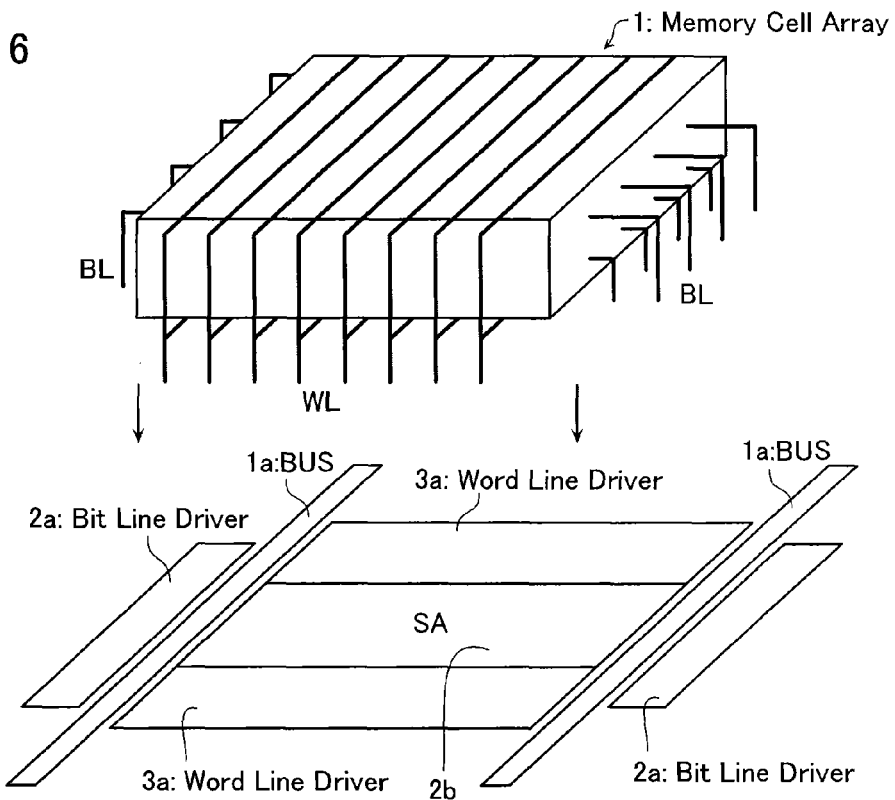
FIG. 6 is a perspective view showing an example of configuration of the memory cell array and peripheral circuits thereof in the nonvolatile semiconductor memory device according to the same embodiment.

FIG. 6 is a perspective view showing an example of configuration of the memory cell array and peripheral circuits thereof in the nonvolatile semiconductor memory device according to the present embodiment.

In the example shown in FIG. 6, in order to perform wiring from the bit line BL and the word line WL of the memory cell array 1 to a substrate circuit, the four sides of the memory cell array 1 are configured as a vertical wiring region. As shown in FIG. 6, the column control circuit 2 and the row control circuit 3 for performing the access operation on the memory cell array 1 are provided on the substrate circuit below the memory cell array 1. The bit line driver 2a is disposed at a position corresponding to both ends in a bit line BL direction of the memory cell array 1. The sense amplifier 2b is disposed at a central underside of the memory cell array 1, and the word line driver 3a is disposed at a position corresponding to both ends in a word line WL direction of the memory cell array 1. A bus 1a is disposed between the sense amplifier 2b and word line driver 3a and the bit line driver 2a. As a result, a chip area of this nonvolatile semiconductor memory device can be made substantially equal to an area of the memory cell array 1.

The bit line driver 2a and the word line driver 3a select the bit line BL and word line WL and set a certain level of voltage to the bit line BL and word line WL, based on an address signal and a command from external. Data is transferred between the bit line driver 2a and the sense amplifier 2b via the bus 1a which is part of a global bus region.

Next, the memory cell MC will be described.

Figure 7:
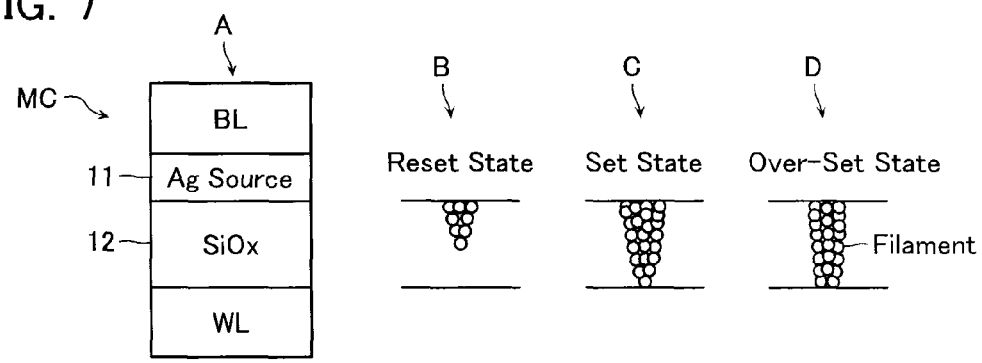
FIG. 7 is a view showing a configuration of a memory cell and characteristics of the memory cell in the nonvolatile semiconductor memory device according to the same embodiment.

FIG. 7 is a schematic view showing a structure and state of the memory cell in the nonvolatile semiconductor memory device according to the present embodiment.

A in FIG. 7 shows the structure of the memory cell MC. The memory cell MC includes a metal layer 11 (in the case shown in FIG. 7, an Ag source layer) and an ion conduction layer 12 (in the case shown in FIG. 7, an amorphous silicon layer) disposed between the bit line BL and the word line WL in order from the bit line BL side. The metal layer 11 functions as a generating source of metal ions, and is formed adopting an active metal, for example, Ag, Cu, or the like, as its material. On the other hand, the ion conduction layer 12 configures a medium where a filament of metal grows. A resistance of the ion conduction layer 12 is high-resistance as an initial state, but becomes low-resistance as the filament grows.

In addition to the above, there exist several other kinds of structures of a resistance varying type memory employing elongation/retraction of a filament. For example, ReRAM employing a transition metal oxide such as $HfO_x$ or $TaO_x$ as a resistance varying layer, is also one such structure. In those cases, a filament consists of oxygen deficiency in the parent material. The description below takes a metal filament system resistance varying type memory as an example, but the present embodiment is not limited to this example, and is applicable provided that the resistance varying type memory is a filament type resistance varying type memory, such as an oxygen deficiency filament system resistance varying type memory, or the like.

Note that it is also possible to form a p type doped polysilicon layer or an n type doped polysilicon layer between the ion conduction layer 12 and the word line WL. In addition, it is also possible to form a diode between the ion conduction layer 12 and the word line WL. Moreover, in FIG. 7, a silicon oxide film ($SiO_x$) was shown as the ion conduction layer 12, but the ion conduction layer 12 is not limited to this, and may be an insulating film such as an amorphous silicon layer, silicon oxynitride ($SiO_xN_y$), silicon nitride ($SiN_x$), a metal oxide film of $HfO_x$ or the like, and so on. Furthermore, the ion conduction layer 12 may be a stacked structure of these, and may be configured as a stacked structure of amorphous silicon and silicon oxide, for example. Moreover, the word line WL shown in FIG. 7 need only function as an electrode, and may be p type doped polysilicon or n type doped polysilicon, or may be a metal.

B through D in FIG. 7 show states of the memory cell MC. In FIG. 7, atoms configuring the filament are shown by unshaded circles. Note that the memory cell MC has the bit line BL connected to its anode side and the word line WL connected to its cathode side.

The memory cell MC has two basic states, namely a reset state and a set state, according to a state of the filament in the ion conduction layer 12.

As shown in B in FIG. 7 for example, the reset state of the memory cell MC refers to a state where the filament has not penetrated the ion conduction layer 12. In the reset state, the memory cell MC is high-resistance.

On the other hand, as shown in C in FIG. 7 for example, the set state of the memory cell MC refers to a state where the filament has penetrated the ion conduction layer 12. In the set state, the memory cell MC is low-resistance.

To render the memory cell MC in the set state, for example, a forward direction bias of about 4-7 V is applied to the memory cell MC. Specifically, the bit line BL connected to the anode side is applied with a setting voltage Vset of about 4-7 V, and the word line WL connected to the cathode side is applied with a ground voltage Vss. As a result, an electric field is applied toward the cathode side in the ion conduction layer 12. This electric field causes metal ions to be attracted from the metal layer 11 to the ion conduction layer 12. As a result, the filament elongates from a boundary surface of the metal layer 11 and the ion conduction layer 12 to the cathode side. Moreover, when this filament reaches the word line WL, the memory cell MC attains the set state.

On the other hand, to render the memory cell MC in the reset state, for example, a reverse direction bias of about 7-8 V is applied to the memory cell MC. Specifically, the bit line BL connected to the anode side is applied with the ground voltage Vss, and the word line WL connected to the cathode side is applied with a resetting voltage Vreset of about 7-8 V. As a result, contrary to the above-described case of rendering the memory cell MC in the set state, an electric field is applied toward the anode side in the ion conduction layer 12. This electric field causes metal atoms forming the filament to be drawn back to the metal layer 11. Note that the metal atoms are one example of atoms configuring the filament. As a result, the filament retracts toward the boundary surface of the metal layer 11 and the ion conduction layer 12. Moreover, when a leading end of the filament separates sufficiently from the word line WL, the memory cell MC attains the reset state.

Moreover, to read the state of the memory cell MC, for example, a forward direction bias of about 5 V is applied to the memory cell MC. Specifically, the bit line BL connected to the anode side is applied with a read voltage Vread of about 5 V, and the word line WL connected to the cathode side is applied with the ground voltage Vss. Then, by detecting a cell current flowing in the memory cell MC at this time by the sense amplifier 2b, the state of the memory cell MC can be read.

Note that, as shown in D in FIG. 7, if a memory cell MC in the set state continues to be further applied with a forward direction bias, the filament continues to elongate thereby becoming strongly connected to the word line WL. This state is referred to as an over-set state. A memory cell MC that once attains the over-set state sometimes does not return to the reset state, even when applied with a reverse direction bias.

In the description below, the memory cell MC attaining the set state is sometimes also called a "setting operation", and the memory cell MC attaining the reset state is sometimes also called a "resetting operation". Note that in the case of the present embodiment, data write means performing the setting operation on the memory cell MC, and data erase means performing the resetting operation on the memory cell MC.

As described above, applying a certain forward direction bias to the memory cell MC allows data write to be performed. However, simply applying the memory cell MC with a forward directionbias sometimes leads to the following problem arising. In other words, the filament formed by applying the forward direction bias includes metal atoms strongly coupled to a parent material of the ion conduction layer 12 (called "strongly-coupled metal atoms" below) and metal atoms weakly coupled to the parent material of the ion conduction layer 12 (called "weakly-coupled metal atoms" below). Therefore, if the memory cell MC in a set state is left in a room or the like, the weakly-coupled metal atoms gradually disperse, whereby the filament gets cut. Thereby, the resistance of the memory cell MC rises, and before long, the memory cell MC undergoes transition to the resetting state. This means that stored data of the memory cell MC has been destroyed.

Accordingly, in the present embodiment, data holding characteristics of the memory cell MC are improved by the following data write.

Figure 8:
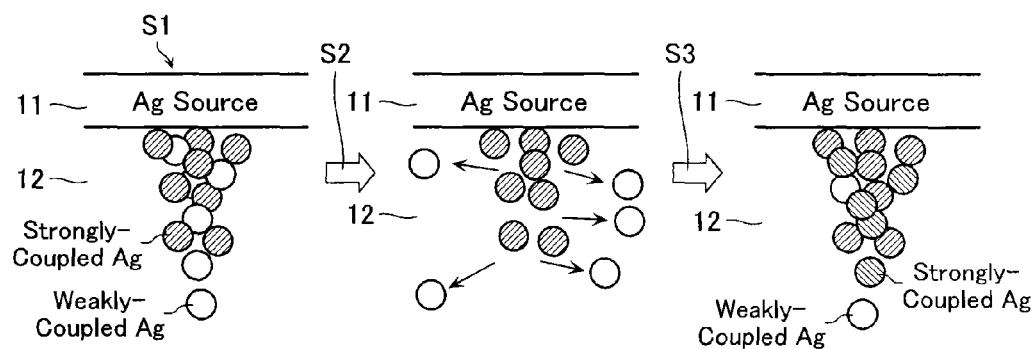
FIG. 8 is a view explaining an outline of data write in the nonvolatile semiconductor memory device according to the same embodiment.

FIG. 8 is a view explaining an outline of data write in the nonvolatile semiconductor memory device according to the present embodiment. FIG. 8 shows the case where the filament is formed by Ag atoms.

First, in step S1, a forward direction bias of the setting voltage Vset is applied to the memory cell MC, thereby elongating the filament in the ion conduction layer 12. As shown in FIG. 8, at this time point, the filament includes both strongly-coupled metal atoms and weakly-coupled metal atoms.

Then, in step S2, the memory cell MC undergoes an operation that removes the weakly-coupled metal atoms included in the filament. This operation may be performed electrically or thermally, but details will be mentioned later. As shown in FIG. 8, this operation results in only the strongly-coupled metal atoms being left in the filament.

Finally, in step S3, a forward direction bias is applied again to the memory cell MC. As a result, metal ions are attracted again from the metal layer 11 to the ion conduction layer 12 to fill the filament. Now, a certain proportion of the newly attracted metal ions become strongly-coupled metal atoms. It is therefore possible to form a filament having more strongly-coupled metal atoms and fewer weakly-coupled metal atoms compared to the filament at the time point of completion of step S1.

According to the data write described above, in step S2, the weakly-coupled metal atoms are removed from the filament, hence it is more difficult for a change in the filament due to the memory cell MC being left in a room or the like to occur. Moreover, in step S3, the filament that has lost metal atoms (weakly-coupled metal atoms) in step S2 can be filled by strongly-coupled metal atoms that are strong with regard to being left in a room or the like. As a result, a memory cell MC having high data holding characteristics can be achieved.

Next, a specific data write procedure will be described. Note that data write can be achieved by execution of a plurality of steps, but below, this series of steps is called a "write sequence".

Figure 9:
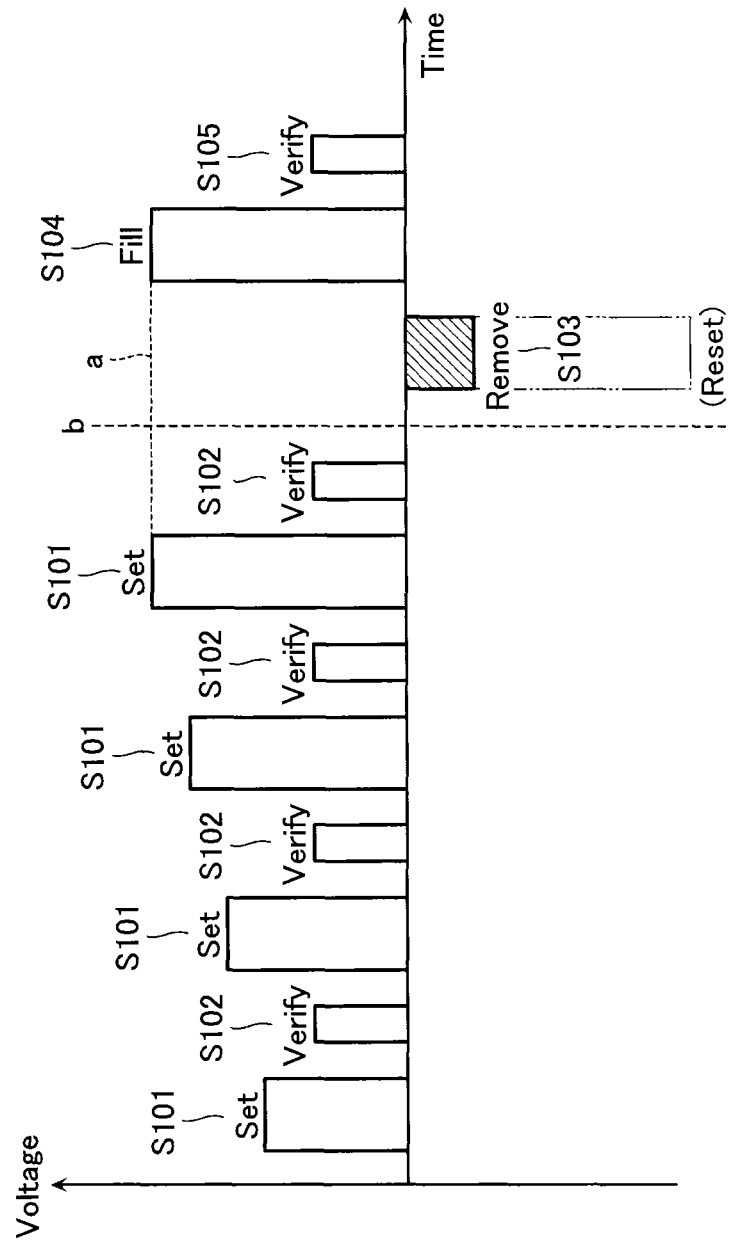
FIG. 9 is a view showing a voltage applied to the memory cell during a write sequence in the nonvolatile semiconductor memory device according to the same embodiment.

FIG. 9 is a view showing a voltage applied to the memory cell during a write sequence in the nonvolatile semiconductor memory device according to the present embodiment. Note that a pulse indicated by the dashed/two-dotted line in FIG. 9 is a resetting pulse ("Reset" shown in FIG. 9) having a height of the resetting voltage Vreset required in the resetting operation. It should be noted that this resetting pulse is indicated for reference, and is not actually applied to the memory cell MC in the write sequence.

First, in step S101, a setting step is executed. The setting step is a step for performing the setting operation on the memory cell MC. Here, a setting pulse ("Set" shown in FIG. 9) configuring a forward direction bias is applied to the memory cell MC. The setting pulse is a pulse having a height of the setting voltage Vset, for example, and is applied to the memory cell MC by applying the setting voltage Vset to the bit line BL and the ground voltage Vss to the word line WL. As a result, metal ions are attracted from the metal layer 11 to the ion conduction layer 12, whereby the filament elongates.

Then, in step S102, a verifying step is executed. The verifying step is a step that determines the state of the memory cell MC. Here, a verifying pulse ("Verify" shown in FIG. 9) configuring a forward direction bias is applied to the memory cell MC. The verifying pulse is a pulse having a height of the read voltage Vread, for example, and is applied to the memory cell MC by applying the read voltage Vread to the bit line BL and the ground voltage Vss to the word line WL. As a result, a cell current flows in the memory cell MC, hence, by detecting this cell current by the sense amplifier 2b, it is confirmed whether the setting operation of the memory cell MC has been completed.

If it is determined in step S102 that the memory cell MC is in the set state, then execution shifts to step S103. On the other hand, if it is determined in step S102 that the memory cell MC is not in the set state, then steps S101 and S102 are re-executed. At this time, the height of the setting pulse may be set constant, or, as shown in FIG. 9, the next setting step may be executed after stepping up the height of the setting pulse.

In step S103, a removing step is executed. The removing step corresponds to step S2 shown in FIG. 8, and is a step that removes the weakly-coupled metal atoms included in the filament. Here, a removing pulse ("Remove" shown in FIG. 9) configuring a reverse direction bias is applied to the memory cell MC. The removing pulse is a pulse of a height such as to draw back to the metal layer 11 only those of the metal atoms forming the filament that are weakly-coupled metal atoms, while leaving those of the metal atoms forming the filament that are strongly-coupled metal atoms. In this regard, the removing pulse is a pulse which is lower than the resetting pulse (dashed/two-dotted line shown in FIG. 9). As a result, only the weakly-coupled metal atoms included in the filament formed by the steps so far are drawn back to the metal layer 11.

Then, in step S104, a filling step is executed. The filling step corresponds to step S3 shown in FIG. 8, and is a step that newly attracts metal ions from the metal layer 11 and fills the filament from which the weakly-coupled metal atoms have been removed in the removing step of step S103, by strongly-coupled metal atoms. Here, a filling pulse ("Fill" shown in FIG. 9) configuring a forward direction bias is applied to the memory cell MC. Note that if a height of the filling pulse is too low, there is a risk that the filament cannot be sufficiently filled by the strongly-coupled metal atoms, whereby the memory cell MC attains an incomplete set state or reset state. Conversely, if the height of the filling pulse is too high, there is a risk that the filament over-elongates, whereby the memory cell MC attains the over-set state. Therefore, the filling pulse is desirably set to about the same height as the setting pulse employed in the setting step last executed (refer to the broken line a shown in FIG. 9).

Then, in step S105, a verifying step similar to step S102 is executed. This verifying step is a step that performs a final confirmation of the state of the memory cell MC. As a result of this verifying step, if it is determined that the memory cell MC is in the set state, then the write sequence is completed. Conversely, if it is determined that the memory cell MC is not in the set state, then steps S103-S105 are re-executed.

As described above, in the case of the present embodiment, execution of the removing step results in removal of the weakly-coupled metal atoms that configure a factor in state change of the filament. Furthermore, execution of the subsequent filling step results in filling of the filament from which the weakly-coupled metal atoms have been removed in the removing step, by strongly-coupled metal atoms. Therefore, the present embodiment makes it possible to provide a nonvolatile semiconductor memory device of high data holding characteristics.

Note that in the present embodiment, the removing step is executed from after the setting operation of the memory cell MC has once been completed (refer to the broken line b shown in FIG. 9). Hence, the number of times of executions of the removing step required is fewer compared to in the embodiments described below, thereby allowing a processing time of the write sequence to be reduced.

Second Embodiment

A second embodiment describes a write sequence different from that of the first embodiment.

Figure 10:
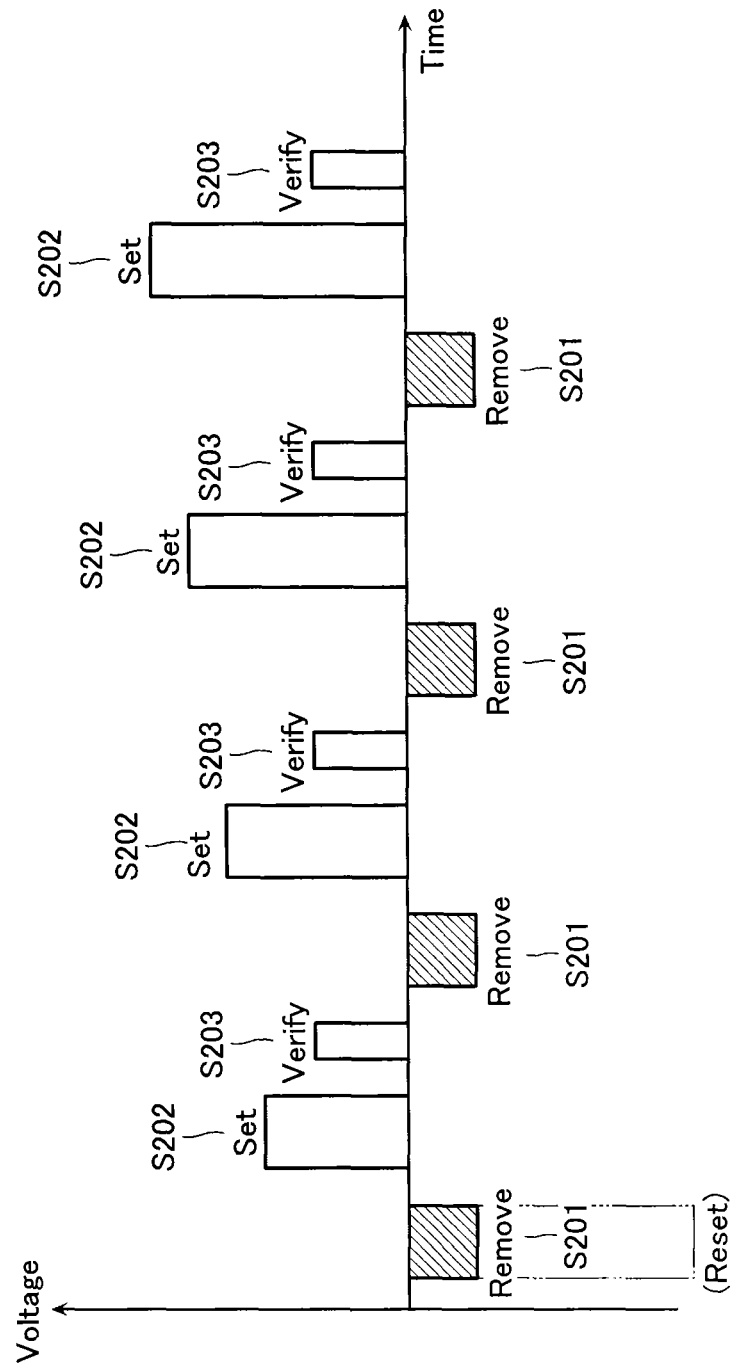
FIG. 10 is a view showing a voltage applied to a memory cell during a write sequence in a nonvolatile semiconductor memory device according to a second embodiment.

FIG. 10 is a view showing a voltage applied to a memory cell during a write sequence in a nonvolatile semiconductor memory device according to the second embodiment. Note that a pulse indicated by the dashed/two-dotted line in FIG. 10 is a resetting pulse ("Reset" shown in FIG. 10) having a height of a resetting voltage Vreset required in a resetting operation. It should be noted that this resetting pulse is indicated for reference, and is not actually applied to the memory cell MC in the write sequence.

First, in step S201, a removing step is executed. This removing step is similar to that in step S103 of the first embodiment. As a result, only the weakly-coupled metal atoms included in the filament already formed by a previous write sequence or the like are drawn back to the metal layer 11.

Then, in step S202, a setting step is executed. This setting step is similar to that in step S101 of the first embodiment. However, this setting step not only simply elongates the filament, but also has significance in filling the filament from which the weakly-coupled metal atoms have been removed in the removing step of step S201, by strongly-coupled metal atoms. In other words, this setting step combines also a role of the filling step in the first embodiment.

Then, in step S203, a verifying step is executed. This verifying step is similar to that in step S102 of the first embodiment. As a result of this step, it is confirmed whether the setting operation of the memory cell MC has been completed.

In step S203, if it is determined that the memory cell MC is in the set state, then the write sequence is completed. On the other hand, if it is determined that the memory cell MC is not in the set state, then steps S201-S203 are re-executed. At this time, the height of the setting pulse may be set constant, or, as shown in FIG. 10, the next setting step may be executed after stepping up the height of the setting pulse ("Set" shown in FIG. 10).

As described above, in the present embodiment, a removing step and a setting step that functions as a filling step are executed, hence a nonvolatile semiconductor memory device of high data holding characteristics can be provided, similarly to in the first embodiment.

Furthermore, in the case of the present embodiment, the removing step is executed before each execution of the setting step functioning as the filling step, hence the weakly-coupled metal atoms included in the filament can be removed more reliably compared to in the first embodiment. Moreover, the write sequence can be achieved merely by repetition of steps S201-S203, hence control can be made more simple compared to in the first embodiment where an execution pattern of the steps is switched around completion of the setting operation of the memory cell MC (broken line b shown in FIG. 9).

Third Embodiment

A third embodiment describes a different write sequence to those of the first and second embodiments.

Figure 11:
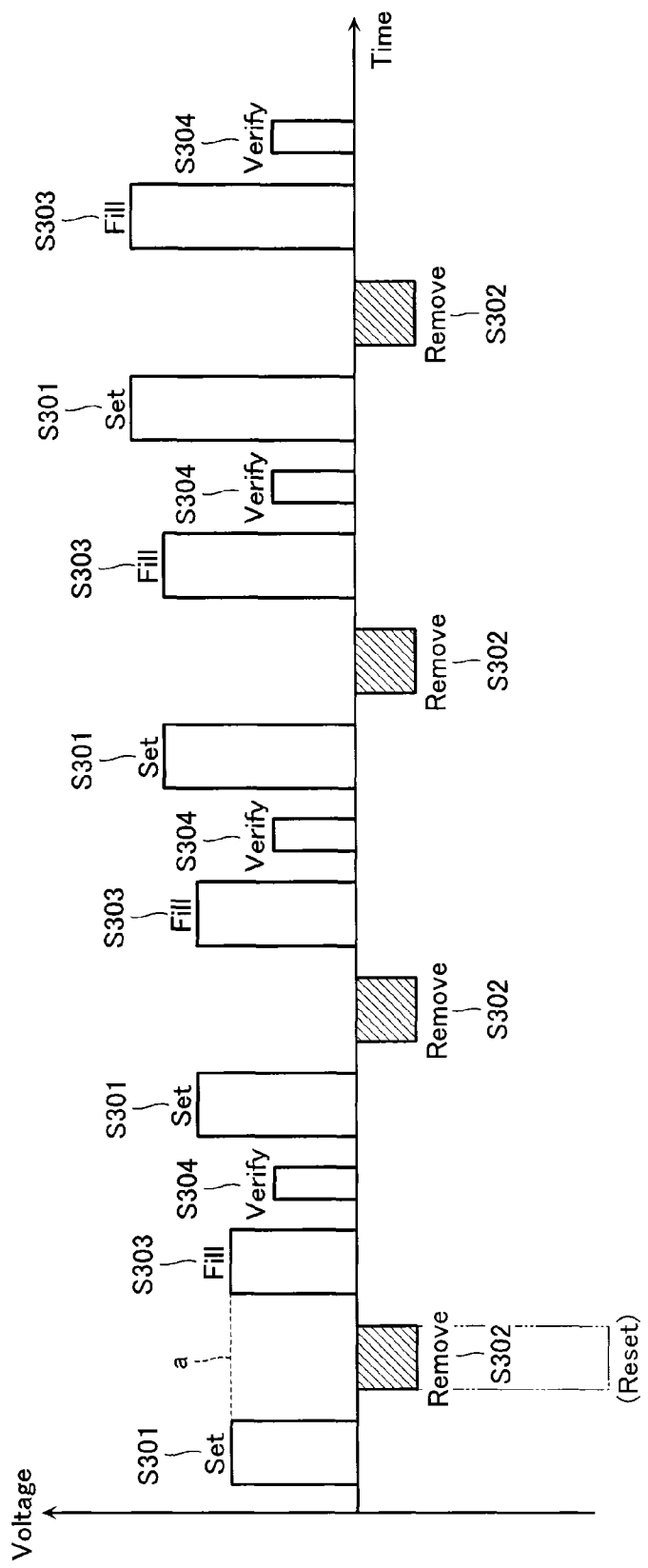
FIG. 11 is a view showing a voltage applied to a memory cell during a write sequence in a nonvolatile semiconductor memory device according to a third embodiment.

FIG. 11 is a view showing a voltage applied to a memory cell during a write sequence in a nonvolatile semiconductor memory device according to the third embodiment. Note that a pulse indicated by the dashed/two-dotted line in FIG. 11 is a resetting pulse ("Reset" shown in FIG. 11) having a height of a resetting voltage Vreset required in a resetting operation. It should be noted that this resetting pulse is indicated for reference, and is not actually applied to the memory cell MC in the write sequence.

First, in step S301, a setting step is executed. This setting step is similar to that in step S101 of the first embodiment. This step causes the filament in the ion conduction layer 12 to elongate.

Then, in step S302, a removing step is executed. This removing step is similar to that in step S103 of the first embodiment. This step causes the weakly-coupled metal atoms included in the filament in the ion conduction layer 12 to be removed.

Then, in step S303, a filling step is executed. This filling step is similar to that in step S104 of the first embodiment. Note that in order to suppress insufficient filling or overfilling, the filling pulse employed in this filling step ("Fill" in FIG. 11) is desirably set to about the same height as the setting pulse ("Set" in FIG. 11) employed in the previous setting step of step S301 (refer to the broken line a shown in FIG. 11). This step causes the filament from which the weakly-coupled metal atoms have been removed in step S302 to be filled by strongly-coupled metal atoms.

Then, in step S304, a verifying step is executed. This verifying step is similar to that in step S102 of the first embodiment. This step results in it being confirmed whether the setting operation of the memory cell MC has been completed.

In step S304, if it is determined that the memory cell MC is in the set state, then the write sequence is completed. On the other hand, if it is determined that the memory cell MC is not in the set state, then steps S301-S304 are re-executed. At this time, the height of the setting pulse and filling pulse may be set constant, or, as shown in FIG. 11, the next setting step and filling step may be executed after stepping up the height of the setting pulse and filling pulse.

As described above, in the present embodiment, a removing step and a filling step are executed, hence a nonvolatile semiconductor memory device of high data holding characteristics can be provided, similarly to in the first embodiment.

Furthermore, in the case of the present embodiment, the removing step and the filling step are executed every single time that the setting step is executed, hence it is possible to form a filament configured by a larger number of strongly-coupled metal atoms compared to in the first embodiment. Moreover, the write sequence can be achieved merely by repetition of steps S301-S304, hence, similarly to in the second embodiment, control can be made more simple compared to in the first embodiment.

Fourth Embodiment

A fourth embodiment describes a modified example of the write sequence of the first through third embodiments. It should be noted that although a modified example of the first embodiment is dealt with here, the present embodiment may be applied also to the second and third embodiments.

Figure 12:
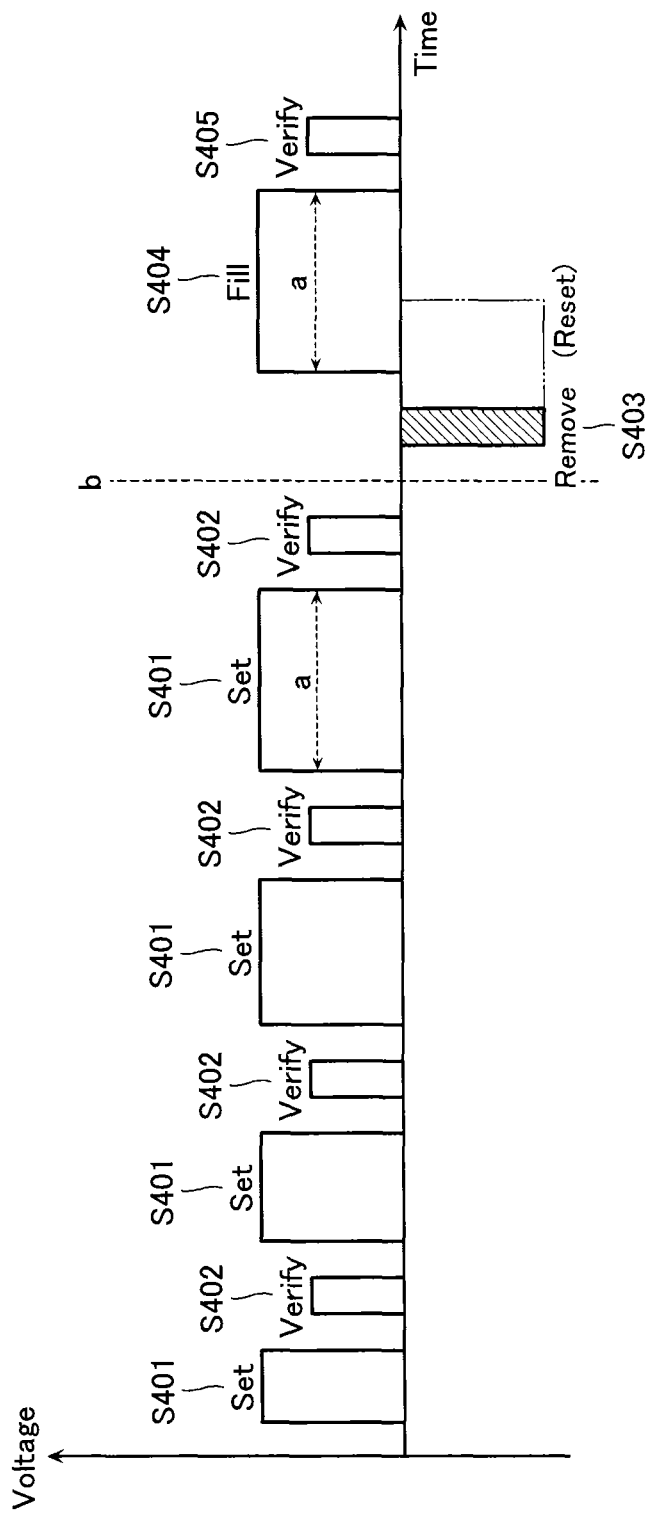
FIG. 12 is a view showing a voltage applied to a memory cell during a write sequence in a nonvolatile semiconductor memory device according to a fourth embodiment.

FIG. 12 is a view showing a voltage applied to a memory cell during a write sequence in a nonvolatile semiconductor memory device according to the fourth embodiment. Note that a pulse indicated by the dashed/two-dotted line in FIG. 12 is a resetting pulse ("Reset" shown in FIG. 12) having a pulse width required in a resetting operation. It should be noted that this resetting pulse is indicated for reference, and is not actually applied to the memory cell MC in the write sequence.

The write sequence of the present embodiment repeatedly executes a setting step (step S401 shown in FIG. 12) and a verifying step (step S402 shown in FIG. 12) until the setting operation of the memory cell MC is completed, and then executes a removing step (step S403 shown in FIG. 12), a filling step (step S404 shown in FIG. 12), and a verifying step (step S405 shown in FIG. 12). These steps S401-S405 respectively correspond to steps S101-S105 of the first embodiment.

However, whereas in the first embodiment, the height of the setting pulse was stepped up when repeatedly executing the setting step and the verifying step, in the present embodiment, as shown in FIG. 12, a pulse width of the setting pulse ("Set" shown in FIG. 12) is stepped up. Even in this case, elongation of the filament in the ion conduction layer 12 can be promoted, similarly to in the setting step of the first embodiment.

Note that the removing pulse ("Remove" shown in FIG. 12) employed in the removing step of the present embodiment need only be capable of removing only the weakly-coupled metal atoms from the filament in the ion conduction layer 12, hence is a pulse having a smaller pulse width than the resetting pulse (dashed/two-dotted line in FIG. 12). Moreover, in order to suppress insufficient filling or over-filling, the filling pulse employed in this filling step ("Fill" in FIG. 12) is desirably set to about the same pulse width as the setting pulse employed in the setting step last executed (refer to the broken line a shown in FIG. 12).

As described above, in the case of the present embodiment, the setting pulse is stepped up by the pulse width. Therefore, while on the one hand more processing time of the write sequence is required compared to when the setting pulse is stepped up by the height, a voltage applied to the memory cell MC can be kept low, whereby stress can be reduced.

Note that stepping up of the setting pulse does not need to be performed by only either one of the height or the pulse width, and may be performed by both of the height and the pulse width.

Fifth Embodiment

A fifth embodiment describes a modified example of the write sequence of the first through fourth embodiments. It should be noted that although a modified example of the first embodiment is dealt with here, the present embodiment may be applied also to the second through fourth embodiments.

Figure 13:
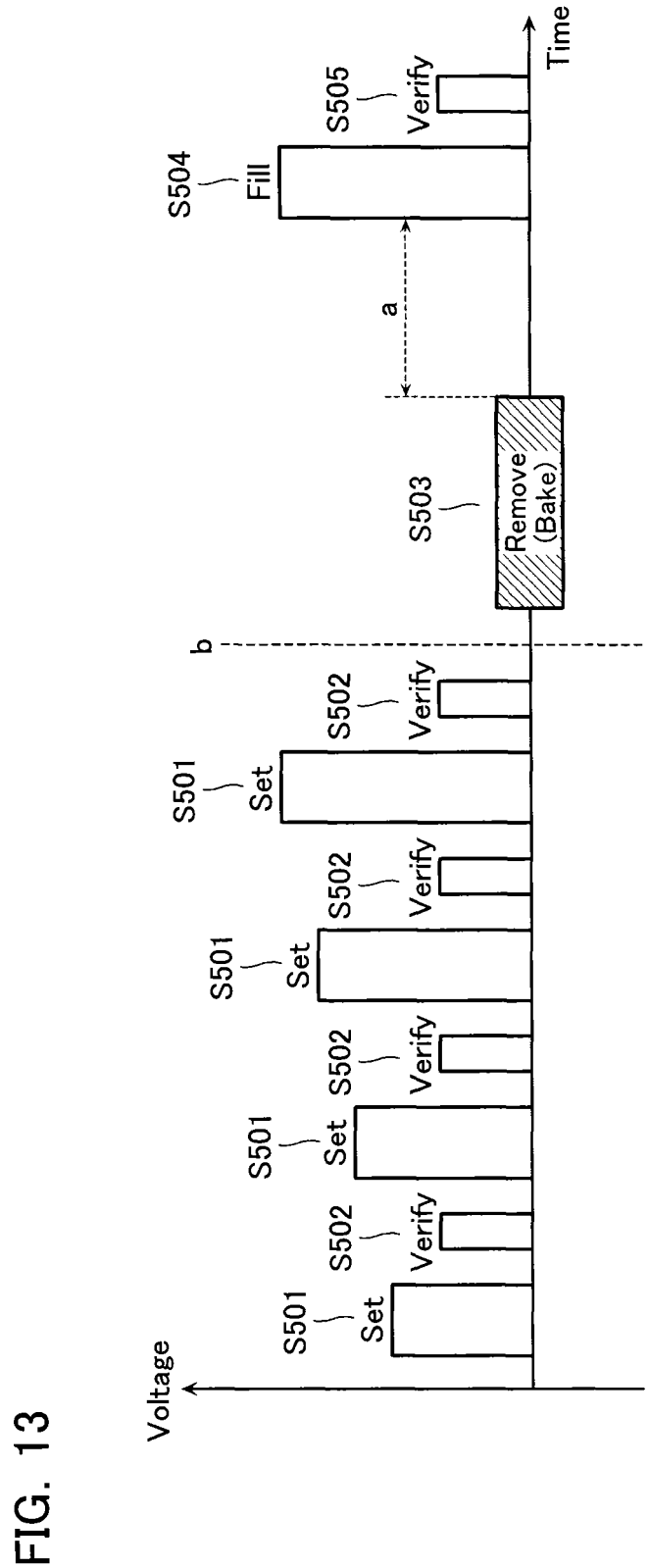
FIG. 13 is a view showing the likes of a voltage applied to a memory cell during a write sequence in a nonvolatile semiconductor memory device according to a fifth embodiment.
Figure 14:
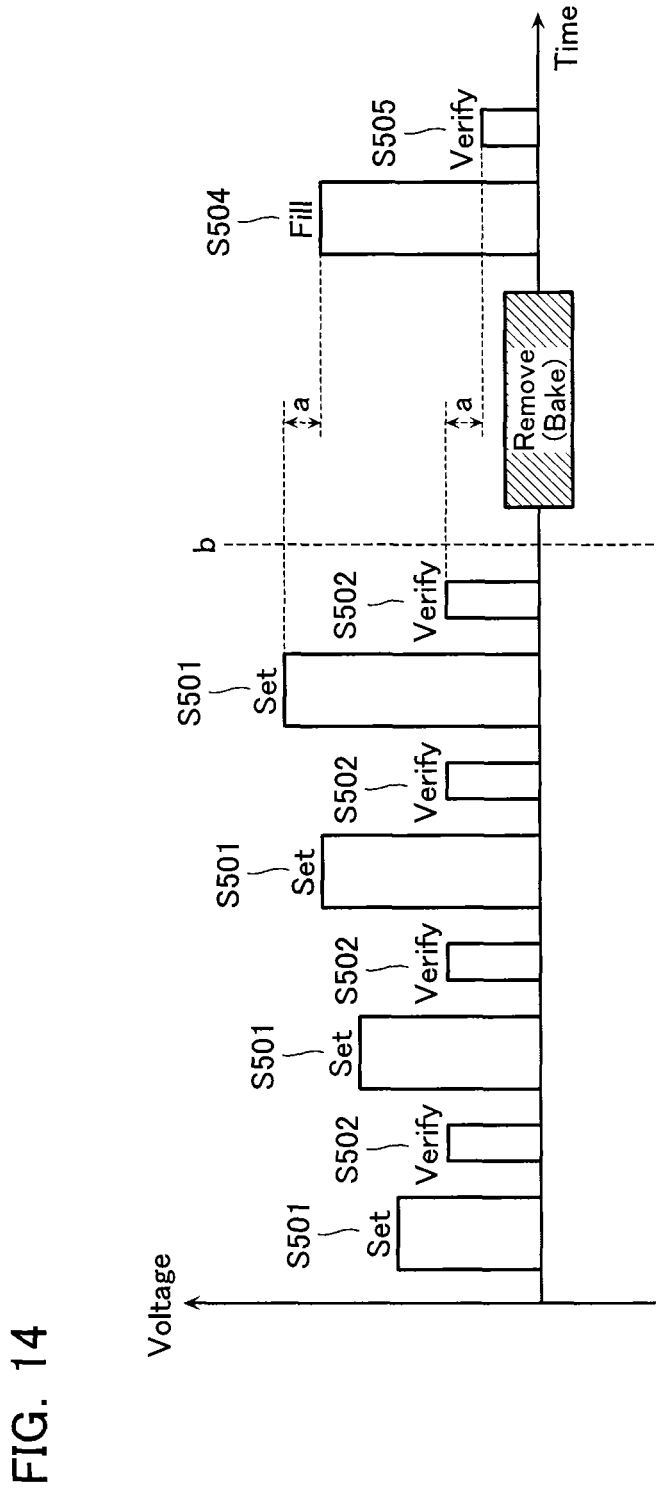
FIG. 14 is a view showing the likes of a voltage applied to the memory cell during another write sequence in the nonvolatile semiconductor memory device according to the same embodiment.

FIGS. 13 and 14 are views showing the likes of a voltage applied to a memory cell during a write sequence in a nonvolatile semiconductor memory device according to the fifth embodiment.

The write sequence of the present embodiment repeatedly executes a setting step (step S501 shown in FIGS. 13 and 14) and a verifying step (step S502 shown in FIGS. 13 and 14) until the setting operation of the memory cell MC is completed, and then executes a removing step (step S503 shown in FIGS. 13 and 14), a filling step (step S504 shown in FIGS. 13 and 14), and a verifying step (step S505 shown in FIGS. 13 and 14). These steps S501-S505 respectively correspond to steps S101-S105 of the first embodiment.

However, whereas in the first embodiment, the removing step was executed electrically using the removing pulse, in the present embodiment, as shown in FIGS. 13 and 14, the weakly-coupled metal atoms included in the filament are thermally diffused by heating the memory cell MC.

Now, when the weakly-coupled metal atoms are removed thermally, the memory cell MC must be heated, but in this case, temperature characteristics of the memory cell MC must be taken into consideration. Accordingly, in the case shown in FIG. 13, a time for cooling the memory cell MC is provided after the removing step up to the following filling step (refer to the broken line a shown in FIG. 13). Moreover, in the case shown in FIG. 14, the filling pulse ("Fill" shown in FIG. 14) employed in the filling step and the verifying pulse ("Verify" shown in FIG. 14) employed in the verifying step following that filling step are set smaller than the setting pulse employed in the setting step and the verifying pulse employed in the verifying step executed before execution of the removing step (refer to broken lines a shown in FIG. 14).

Next, an example of configuration of a nonvolatile semiconductor memory device for achieving the write sequence shown in FIGS. 13 and 14 will be described.

Figure 15:
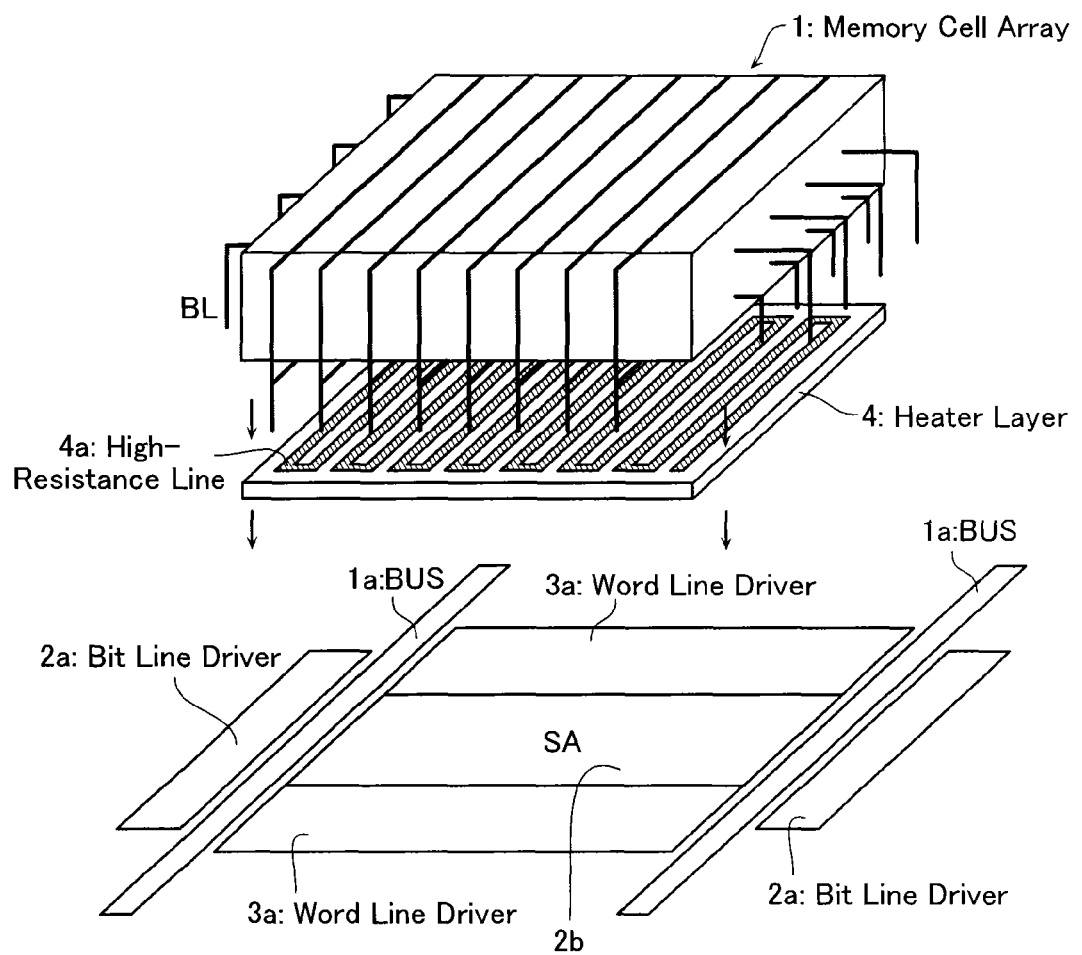
FIG. 15 is a perspective view showing an example of configuration of a memory cell array and peripheral circuits thereof in the nonvolatile semiconductor memory device according to the same embodiment.

FIG. 15 is a view showing an example of configuration of a memory cell array and peripheral circuits thereof in the nonvolatile semiconductor memory device according to the present embodiment. In the case of the present embodiment, a heater layer 4 having about the same area as the memory cell array 1 is further inserted between the substrate circuit and the memory cell array 1, with respect to an example of configuration shown in FIG. 6 described in the first embodiment. This heater layer 4 has a high-resistance line 4a disposed therein. In the case of this example of configuration, providing the heater layer 4 allows the entire memory cell array 1 to be heated by Joule heat generated from the high-resistance line 4a. Note that the heater layer 4 is not limited to spanning the entire memory cell array 1 as in FIG. 15, and it is also possible to heat the memory cells MC on a block basis by partitioning the heater layer 4.

As described above, in the case of the present embodiment, similar advantages to when the removing pulse is employed can be obtained even when the memory cell MC is heated. In other words, the present embodiment also makes it possible to provide a nonvolatile semiconductor memory device of high data holding characteristics.

Here, if two pulses have substantially same height, the difference of heights of two pulses is 0.7V or less. If two pulses have same height, the difference of heights of two pulses is 0.3V or less. If two pulses have substantially same width, the width of the narrower pulse is 70% or more of the width of the wider pulse. If two pulses have same width, the width of the narrower pulse is 90% or more of the width of the wider pulse. These margins are described based on typical margin of error during measurement.

[Other]

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A method of writing data of a nonvolatile semiconductor memory device, the device comprising a memory cell array including first lines, second lines intersecting the first lines, and memory cells provided one at each of intersections of the first lines and the second lines and each storing data by a data storing state of a filament, the method comprising:
repeatedly executing a setting operation and a verifying operation until the memory cell attains a desired data storing state, and then executing a removing operation, the setting operation applying an electrical setting pulse having a first polarity to the memory cell, the verifying operation applying a verifying pulse to the memory cell, the verifying pulse being used to confirm whether the memory cell has attained the desired data storing state, the setting pulse after applying the verifying pulse having an amplitude which is higher than that of the setting pulse before applying the verifying pulse, the removing operation applying an electrical removing pulse having a second polarity opposite to the first polarity to the memory cell, and maintaining the attained desired data storing state, the removing pulse having an amplitude which is lower than that of a resetting pulse, the resetting pulse having the second polarity and being used to erase the attained desired data storing state.

2. The method of writing data of the nonvolatile semiconductor memory device according to claim 1, further comprising executing a filling operation after execution of the removing operation, the filling operation applying a filling pulse having the first polarity to the memory cell.

3. The method of writing data of the nonvolatile semiconductor memory device according to claim 1, wherein the executing the filling operation uses the filling pulse of substantially same amplitude as the setting pulse of the setting operation last executed.

4. A method of writing data of a nonvolatile semiconductor memory device, the device comprising a memory cell array including first lines, second lines intersecting the first lines, and memory cells provided one at each of intersections of the first lines and the second lines and each storing data by a data storing state of a filament, the method comprising:

repeatedly executing a removing operation and then a setting operation until the memory cell attains a desired data storing state, the setting operation applying an electrical setting pulse having a first polarity to the memory cell, the removing operation applying an electrical removing pulse having a second polarity opposite to the first polarity to the memory cell, and maintaining the attained desired data storing state, the removing pulse having an amplitude which is lower than that of a resetting pulse, the resetting pulse having the second polarity and being used to erase the attained desired data storing state, the setting pulse having an amplitude that is increased after each applying the setting pulse, and the removing pulse having an amplitude that is constant.

5. The method of writing data of a nonvolatile semiconductor memory device according to claim 4, further comprising executing a verifying operation after each execution of the setting operation, the verifying operation applying a verifying pulse to the memory cell, the verifying pulse being used to confirm whether the memory cell has attained the desired data storing state.

6. A method of writing data of the nonvolatile semiconductor memory device, the device comprising a memory cell array including first lines, second lines intersecting the first lines, and memory cells provided one at each of intersections of the first lines and the second lines and each storing data by a data storing state of a filament, the method comprising:

repeatedly executing a setting operation, a removing operation, a filling operation, and a verifying operation in this order until the memory cell attains a desired data storing state, the setting operation applying an electrical setting pulse having a first polarity to the memory cell, the removing operation applying an electrical removing pulse having a second polarity opposite to the first polarity to the memory cell, and maintaining the attained desired data storing state, the removing pulse having an amplitude which is lower than that of a resetting pulse, the resetting pulse having the second polarity and being used to erase the attained desired data storing state, the filling operation applying a filling pulse to the memory cell, the filling pulse having the first polarity, the verifying operation applying a verifying pulse to the memory cell, the verifying pulse being used to confirm whether the memory cell has attained the desired data storing state, the setting pulse after applying the verifying pulse having an amplitude which is higher than that of the setting pulse before applying the verifying pulse.

7. The method of writing data of the nonvolatile semiconductor memory device according to claim 6, wherein the method executes the filling operation using the filling pulse of substantially same amplitude as the setting pulse of the setting operation.

* * * * *